(12) United States Patent
Robbe et al.

(10) Patent No.: US 7,764,093 B2
(45) Date of Patent: Jul. 27, 2010

(54) VOLTAGE SHIFT CONTROL CIRCUIT FOR PLL

(75) Inventors: Michel Robbe, Conflans Saint Honorine (FR); Hervé Guegnaud, Maurepas (FR)

(73) Assignee: EADS Telecom, Montigny le Bretonneux (FR)

( * ) Notice: Subject to any disclaimer, the term of this patent is extended or adjusted under 35 U.S.C. 154(b) by 211 days.

(21) Appl. No.: 10/556,647

(22) PCT Filed: May 17, 2004

(86) PCT No.: PCT/EP2004/006063

§ 371 (c)(1),
(2), (4) Date: Nov. 10, 2005

(87) PCT Pub. No.: WO2004/105249

PCT Pub. Date: Dec. 2, 2004

(65) Prior Publication Data
US 2007/0024378 A1  Feb. 1, 2007

(30) Foreign Application Priority Data
May 22, 2003  (FR) .................................. 03 06145

(51) Int. Cl.
*H03L 7/06* (2006.01)
(52) U.S. Cl. ....................................... 327/156; 327/159
(58) Field of Classification Search ........................ None
See application file for complete search history.

(56) References Cited

U.S. PATENT DOCUMENTS 4,511,858 A    4/1985   Charavit et al.
4,847,569 A    7/1989   Badger et al.
6,107,889 A *  8/2000   Strange et al. ................. 331/17
6,611,161 B1 * 8/2003   Kumar et al. ................. 327/157
6,693,494 B2 * 2/2004   Fan ............................... 331/17
6,819,186 B2   11/2004  Schechinger et al.
6,924,706 B2   8/2005   Balm et al.

FOREIGN PATENT DOCUMENTS

| EP | 0 041 882 | 12/1981 |
| EP | 0 664 617 | 7/1995 |
| EP | 0 896 434 | 2/1999 |
| WO | WO 01/76072 | 10/2001 |
| WO | WO 02/091580 | 11/2002 |

OTHER PUBLICATIONS

Nilsson, James W. and Riedel, Susan A., Electric Circuits, 1996, Addison-Wesley Publishing Company, Inc. 5$^{th}$ Edition, pp. 227.*
Written Opinion, Appl. No. PCT/EP2004/006063.
International Search Report dated Nov. 8, 2004; Appl. No. PCT/EP2004/006063.

* cited by examiner

*Primary Examiner*—Lincoln Donovan
*Assistant Examiner*—Khareem E Almo
(74) *Attorney, Agent, or Firm*—McCracken & Frank LLP

(57) ABSTRACT

A PLL comprises a PFD, a loop filter and a VCO, as well as a voltage shift capacitor coupling the PFD and the VCO. A voltage shift control circuit is placed in parallel with the voltage shift capacitor. This circuit comprises controlled charging means, which are designed to charge the voltage shift capacitor according to a channel control signal. It also comprises controlled pre-charging means which are designed to accelerate the charging of the voltage shift capacitor by the controlled charging means. It further comprises controlled biasing means, designed to ensure the bias of the input during the pre-charging of the voltage shift capacitor.

14 Claims, 3 Drawing Sheets

VOLTAGE SHIFT CONTROL CIRCUIT FOR PLL

BACKGROUND OF THE INVENTION

1. Technical Field

The present invention relates to a voltage shift control circuit intended to be placed in parallel with at least one voltage shift capacitor coupling the phase or frequency comparator and the voltage controlled oscillator of a phase locked loop (PLL).

2. Related Art

PLLs have numerous uses in the electronics industry, among which is the generation of phase modulated or frequency modulated signals. The applications of the present invention are particularly intended for this use. In fact the invention can be applied in particular to the radio-frequency (RF) transmitters of fixed stations and of mobile terminals of digital radio-communications systems.

FIG. 1 illustrates the operating principle of a PLL. The PLL comprises a phase or frequency comparator (PFD) 10 which receives two input signals. The first one is a phase or frequency reference signal FREF and the second one is a signal FVCO coming from a voltage controlled oscillator (VCO) 30 and having undergone a frequency division in a variable ratio frequency divider 40. The output voltage of the PFD is integrated by a low pass filter 20, called a loop filter. The output of the filter controls the VCO in such a way as to align the phases of the two input signals FREF and FVCO of the PFD. The VCO delivers the output signal of the PLL which oscillates about a reference frequency controlled and modulated by the PLL.

It is possible to introduce frequency modulation (FM) at the level of the divider 40 by controlling the variable division ratio.

The performance characteristics of the PLL determine, in particular, the spectral purity of the output signal and the linearity of the modulation. In this respect, the absence of noise on the input of the VCO and the linearity of the gain of the PFD are of great importance. Embodiments of the PFD have been proposed which favour the linearity of the gain (see WO 97/01884). These embodiments necessitate that the DC component of the output signal of the PFD should correspond with an operating point substantially corresponding to the common mode (CM) voltage, that is to say to Vdd/2, where Vdd denotes the power supply voltage of the PLL.

In order to be able to change channels in the transmitter incorporating the PLL, means are provided for changing the DC component at the input of the VCO. In fact, the mean frequency of the output signal varies according to the channel used, which means that the theoretical mean voltage at the input of the VCO can vary from 0 to Vdd. The means forming a voltage translator comprise, for example, a high value capacitor placed in series between the output of the PFD and the input of the VCO.

Fast charging (or discharging) of this capacitor is desirable in order to reduce the time lost when changing channels, in particular during handover operations of the mobile terminal comprising the PLL. Even though in the rest of this description reference is made only to the charging of the capacitor, it is of course understood that this term refers both to the capacitive charging and to the capacitive discharging of this component, the capacitive charging being obtained by a positive charging current and the capacitive discharging being obtained by a negative charging current.

BRIEF DESCRIPTION OF THE INVENTION

The purpose of the invention is to propose means for allowing a rapid charging of the capacitive means forming a voltage translator, during changes of channel in the transmitter incorporating the PLL, whilst ensuring good performance characteristics of the PLL in terms of spectral purity and of linearity.

Thus purpose is achieved by means of a voltage shift control circuit intended to be placed in parallel with at least one voltage shift capacitor coupling the phase comparator and the voltage controlled oscillator of a phase locked loop. The circuit comprises:

- an input, intended to be coupled with the output of the phase comparator;
- an output, intended to be coupled with the input of the voltage controlled oscillator;
- controlled charging means, designed to charge the voltage shift capacitor according to a control signal;
- controlled pre-charging means, designed to accelerate the charging of the voltage shift capacitor by the controlled charging means; and,
- controlled polarization means, designed to ensure the polarization of the input during the pre-charging of the voltage shift capacitor.

A second aspect of the invention relates to a PLL comprising a phase or frequency comparator, a loop filter, a voltage controlled oscillator, a voltage shift capacitor connecting the phase comparator and the voltage controlled oscillator, and a voltage shift control circuit such as defined above, which is placed in parallel with the voltage shift capacitor.

A third aspect of the invention relates to a radio-frequency transmitter, comprising a phase locked loop according to the second aspect, for generating a radio-frequency signal to be transmitted.

A fourth and a fifth aspect of the invention further relate to a mobile terminal and to a base station respectively of a radio-communications system comprising a radio-frequency transmitter according to the third aspect.

BRIEF DESCRIPTON OF THE DRAWINGS

DESCRIPTION OF PREFERRED EMBODIMENTS

The present description provides example embodiments of a circuit according to the invention. The circuit can be produced in the form of an ASIC (Application Specific Integrated Circuit) circuit, for example using CMQS submicronic (0.35 μm or less) technology.

Figure 2:
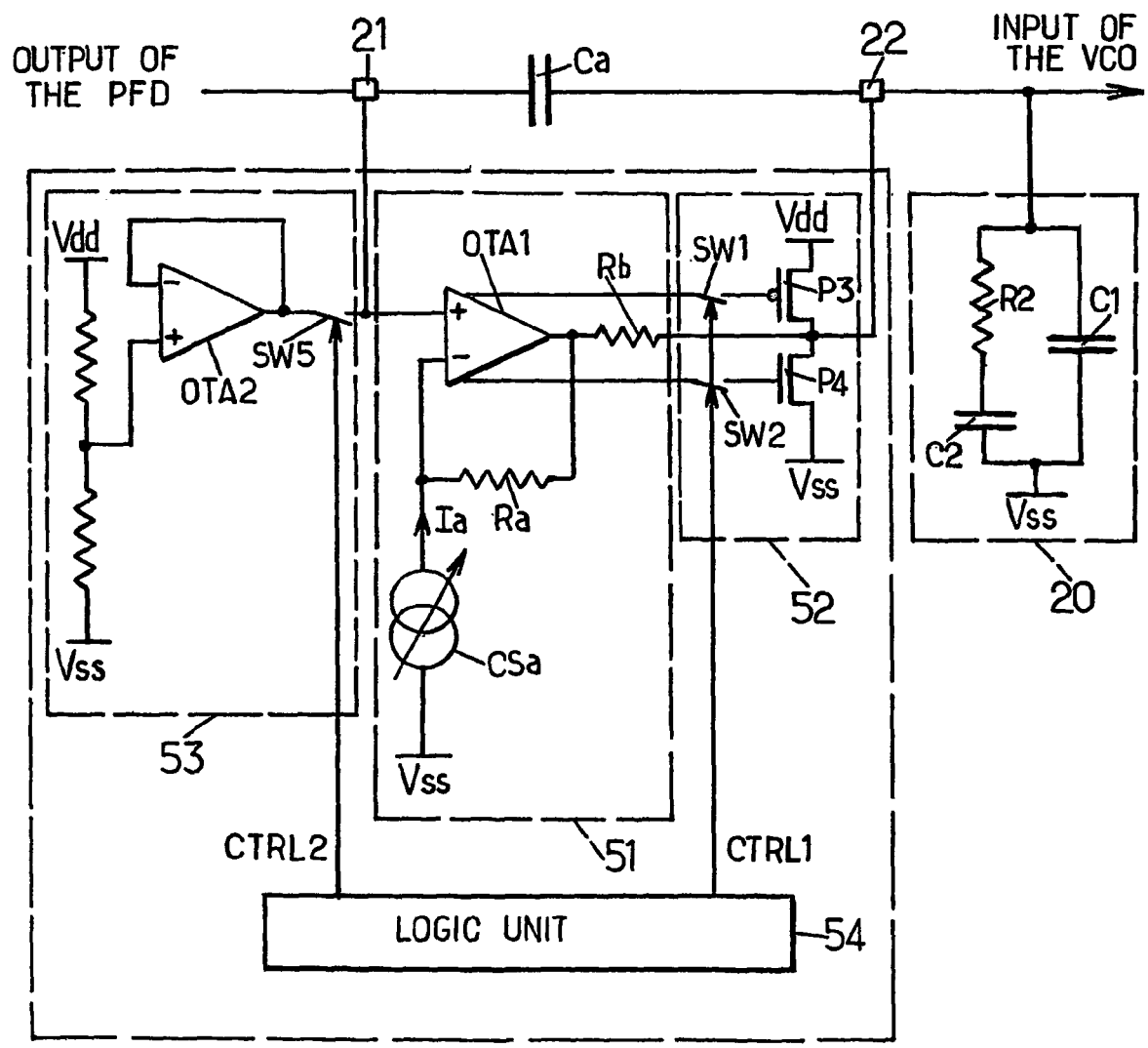
FIG. 2 is a circuit diagram illustrating a first embodiment of a circuit according to the invention.

FIG. 2 is a circuit diagram which shows a first embodiment of the circuit according to the invention.

The circuit 50 is powered via a high voltage power supply terminal Vdd and a low voltage power supply terminal Vss. In one example, the low voltage power supply potential Vss is the ground potential and the high voltage power supply potential Vdd, or power supply voltage, is equal to 3.3 V.

The circuit comprises an input 21 and an output 22. The input 21 is intended to be coupled with the output of the PFD of a PLL and the output 22 is intended to be coupled with the input of the VCO of the PLL.

The function of the circuit 50 is, at the moment of channel change, to pre-charge the input voltage of the VCO to a value close to the mean value corresponding to the chosen channel, whilst maintaining the output voltage of the PFD near the common mode voltage, that is to say Vdd/2, or 1.65 V in this example. Outside of the periods following a change of channel, the circuit 50 makes it possible to compensate for the current losses at the input of the VCO.

A capacitor Ca of high value, for example 1 µF, forming voltage shifting means, is typically present between the input 21 and the output 22 of the circuit 50, being placed between the output of the PFD and the input of the VCO of the PLL. This capacitor Ca can of course be replaced by any essentially capacitive structure, in particular by an assembly comprising one or more capacitors connected in series and/or in parallel.

In FIG. 2, there is also shown an example of a loop filter 20 of the PLL. This filter 20 is a low-pass filter in this case comprising a capacitor C1 connected in parallel with an RC network, this later comprising a resistor R2 in series with a capacitor C2, between the output 22 of the circuit and the Vss terminal. More particularly, the filter 20 is placed in the PLL, between the output of the PFD and the input of the VCO, downstream of the capacitor Ca. The invention is not of course limited to this example embodiment of the loop filter 20 and any low-pass filter structure may be suitable.

Figure 1:
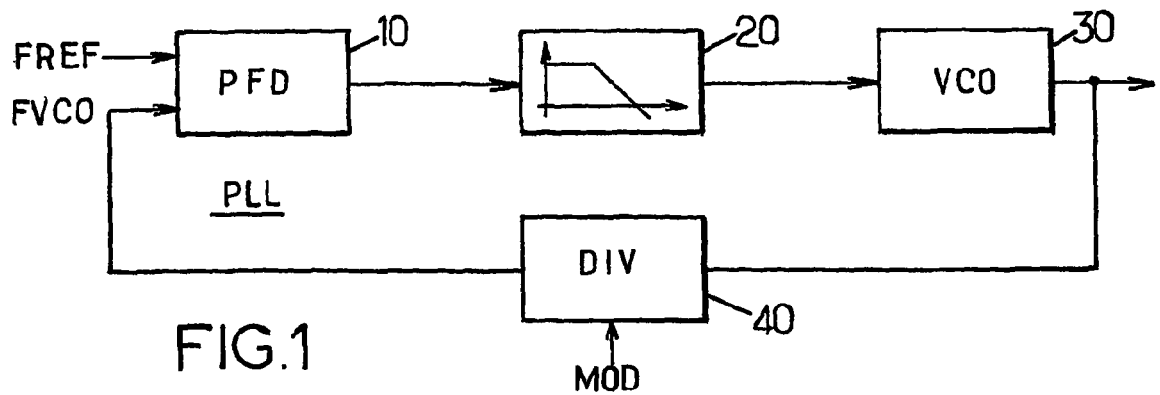
FIG. 1 is a functional block diagram of a PLL.

The other components of the PLL can comprise a variable ratio frequency divider placed in the feedback path, as illustrated by the block diagram shown in FIG. 1.

Essentially, the circuit 50 comprises analogue means 51, 52 and 53, and a logic unit 54.

Controlled polarization means 53 are designed to ensure the polarization of the input 21 during the pre-charging of the capacitor Ca, by imposing the common mode voltage on that input. The means 53 can for example comprise an OTA (Operational Transconductance Amplifier) OTA2 connected as a voltage follower. The non-inverting input of this operational amplifier receives the common mode voltage generated by a resistive bridge comprising two identical resistors of high value connected in series between the terminals Vdd and Vss. The inverting input of the operational amplifier is connected to the input 21 through a control switch SW5. The switch SW5 is controlled by a control signal CTRL2 generated by the logic unit 54.

In the activation of the polarization means configuration, that is to say when the switch SW5 is closed, the operational amplifier OTA2 imposes the common mode voltage on the terminal 21 of the circuit 50. That is why this amplifier is also called a common mode follower.

Controlled charging means 51, are designed to charge the capacitor Ca according to a channel control signal received from outside of the circuit. This channel control signal is for example coded in 8 bits. Its function is to control the input voltage of the VCO at a value close to the mean value (that is to say disregarding the modulation) corresponding to a chosen radio channel.

For this purpose, the means 51 comprise an operational transconductance amplifier OTA1 connected as a voltage follower in parallel with the capacitor Ca. They also comprise a controlled current source CSa which supplies a positive or negative current Ia through a resistor Ra placed in series in the feedback loop of the operational amplifier OTA1. Stated otherwise, the current source CSa is connected between the terminal Vss and the inverting input of the operational amplifier OTA1, this input also being looped to the output of this amplifier via the resistor Ra. The output of the operational amplifier OTA1 is connected to the output 22 of the circuit through a resistor Rb of high value, for example 1 MΩ. The non-inverting input of the operational amplifier OTA1 is connected to the input 21 of the circuit and also to the output of the operational amplifier OTA2 of the means 53 via the switch SW5. Thus it receives the common mode voltage as a reference when this switch is closed by the signal CTRL2, that is to say when the pre-charging is activated. In this way, the charging of the capacitor Ca is carried out when there is a change of radio channel, at a voltage controlled by the aforesaid control signal from the common mode voltage. This charging is therefore optimized in time.

The current source CSa is for example produced in the form of a digital-to-analogue converter supplying, in the case of a resistor Ra of 33 kΩ, a current varying from −50 µA to +50 µA, by the intermediary of the control signal coded in 8 bits. Such a converter can advantageously be produced from 255 unit current sources. With regard to production on silicon, these unit current sources are preferably mixed inside a barycentric matrix in order to limit current dispersions due to thermal effects.

It will be noted that the noise of the operational amplifier OTA1, when the pre-charging is deactivated, is filtered by the components Rb, C1 and C2 disposed downstream. This noise does not therefore affect the performance characteristics of the PLL. This is an advantage in comparison with other possible structures, for which low noise operational amplifiers, occupying more space on silicon and consuming more energy, are required.

The circuit 50 finally comprises controlled pre-charging means 52 which are designed to accelerate the charging of the external capacitor Ca by the controlled charging means 51 when there is a channel change. The means 52 comprise a push-pull stage formed from two transistors P3 and P4, which are a PMOS transistor and an NMOS transistor respectively, placed in series between the terminals Vdd and Vss. The control gates of the transistors P3 and P4 are connected to the control gates of corresponding transistors of a push-pull output stage of the operational amplifier OTA1 (see FIG. 4, described later) through controlled switches SW1 and. SW2 respectively. The output of the push-pull stage P3-P4 is connected to the output 22 of the circuit. Thus connected, this stage short-circuits the resistor Rb of high value when the switches SW1 and SW2 are closed. The closing of these switches is controlled by a control signal CTRL1 generated by the logic unit 54, when there is a change of radio channel.

Figure 3:
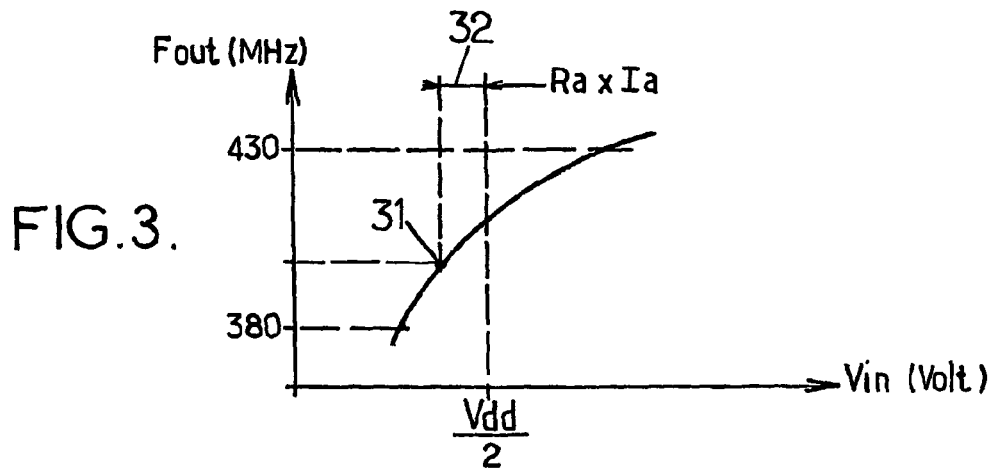
FIG. 3 is a graph showing an examplary response curve of a VCO.

The functioning of the charging means 51 will now be described with reference to the diagram shown in FIG. 3. In this figure, a curve has been shown which corresponds to a typical response curve of a VCO. More particularly, the curve shows the trend of the frequency Fout of the signal delivered on output from the VCO, as a function of the input voltage Vin of the VCO. In the applications of the invention that are envisaged, the VCO must be able to deliver a radio-frequency signal in a continuous band of width 50 MHz, ranging from about 380 MHz to about 430 MHz, when the input voltage Vin varies between 1 V and Vdd. The VCO is calibrated in such a way that the frequency Fout is situated substantially in the centre of the abovementioned 50 MHz band when the voltage Vin is substantially equal to the common mode voltage Vdd/2.

Let it be assumed that the chosen channel is situated at a frequency corresponding to the point 31 on the curve. The means 51 must then generate a voltage shift represented by the interval 32 in the figure, with respect to the voltage Vdd/2. This shift is obtained by controlling the current source CSa in such a way that it supplies a current such that the product Ra×Ia is equal to the voltage shift 32.

Figure 4:
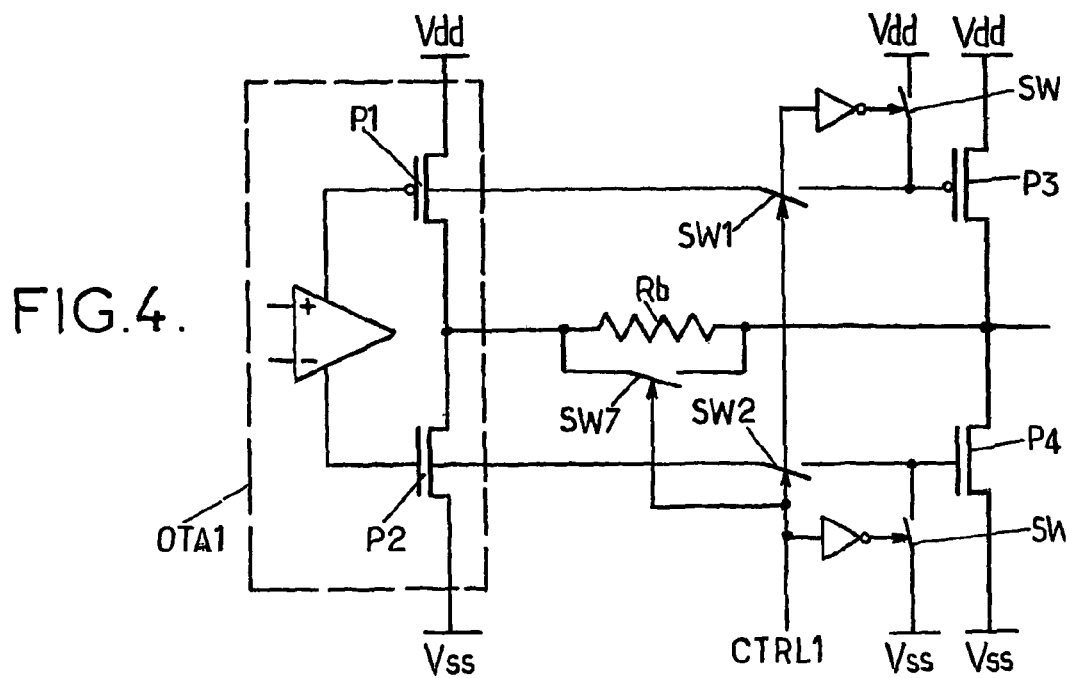
FIG. 4 is a circuit diagram showing an example of a detailed embodiment of the pre-charging means of the circuit according to the invention.

FIG. 4 shows in a detailed way the coupling of the pre-charging means 52 with the operational amplifier OTA1. The latter is represented by the symbol of a differential amplifier (i.e. a triangle) followed by a push-pull output stage composed of two transistors P1 and P2, that are a PMOS transistor and an NMOS transistor respectively, in series between the terminals Vdd and Vss. The push-pull output stage P1-P2 is connected to one end of the resistor Rb, the other end of which is connected to the output of the push-pull stage P3-P4 of the means 52. The control gates of the transistors P3 and P4 are connected to the control gates of the transistors P1 and P2 respectively by the intermediary of the aforementioned controlled switches SW1 and SW2.

When the signal CTRL1 is in a specified logic state, for example the logic state 1, it thus causes the closing of the switches SW1, SW2, SW7 and SW8. In this way the transistors P1 and P3, on the one hand, and the transistors P2 and P4, on the other hand, become connected as a current mirror. Furthermore, the resistor Rb is then short-circuited. It is possible to provide a switch SW7 in parallel with the resistor Rb, the closing of this switch being controlled by the signal CTRL1 when the pre-charging means 52 are activated, in such a way as to minimize the effects of an unbalance between the push-pull P1-P2 and the push-pull P3-P4.

The transistors P3 and P4 preferably have a gate width substantially greater than that of the transistors P1 and P2 respectively and they deliver a charging current for the capacitor Ca that is higher than the current delivered by the transistors P1 and P2. For example, the transistors P1 and P2 can be dimensioned such that they deliver a charging current of 100 μA and the transistors P3 and P4 can be dimensioned such that they deliver a current 20 times higher, that is to say a current of 2 mA in this example. Stated otherwise, the pre-charging means 52 make it possible to accelerate the charging of the capacitor Ca when they are activated by the signal CTRL1.

In an advantageous embodiment, switches SW3 and SW4 are also placed between the gate of the transistor P3 and the terminal Vdd and between the gate of the transistor P4 and the terminal Vss respectively. These switches SW3 and SW4 are controlled by a signal corresponding to the inverse of the control signal CTRL1. In this way, the switches SW3 and SW4 are closed when the pre-charging means 52 are deactivated, such that the transistors P3 and P4 are cut off. In this way the generation of leakage currents through these transistors in the deactivated state of the means 52 is prevented.

Returning to FIG. 2, the functioning of, the pre-charging means 52 and of the polarization means 53 when there is a change of radio channel will now be explained.

When there is a change of radio channel, the logic unit 54 sets the control signal CTRL2 in such a way that it closes the switch SW5. Consequently, the common mode voltage Vdd/2 is imposed on the input 21 of the circuit. It is also supplied as a reference to, the operational amplifier OTA1 of the charging means 51.

Similarly, the logic unit 54 sets the control signal CTRL1 in such a way that it closes the switches SW1 and SW2. The push-pull stage of the pre-charging means 52, of which the transistors P3 and P4 are connected as a mirror of the corresponding transistors of the push-pull output stage of the amplifier OTA1, then generates a high charging current, designed to accelerate the charging of the capacitor Ca in comparison with what it would be if only the charging means 51 were present.

It will be noted that the low output impedance of the operational amplifier OTA2 operating as a common mode follower allows the evacuation of the charging current of the capacitor Ca.

After a given time, the logic unit 54 sets the control signals CTRL1 and CTRL2 in such a way as to deactivate the means 52 and 53 respectively. The output of the operational amplifier OTA2 is thus put into the high impedance state, as are the control gates of the transistors P3 and P4 of the pre-charging means 52. However, the means 51 remain active. In this way, possible current leakages at the input of the VCO are compensated by the charging of the capacitor Ca by the means 51. In fact, the latter remain controlled by the channel control signal such that the current Ia continues to flow in the resistor Ra.

Figure 5:
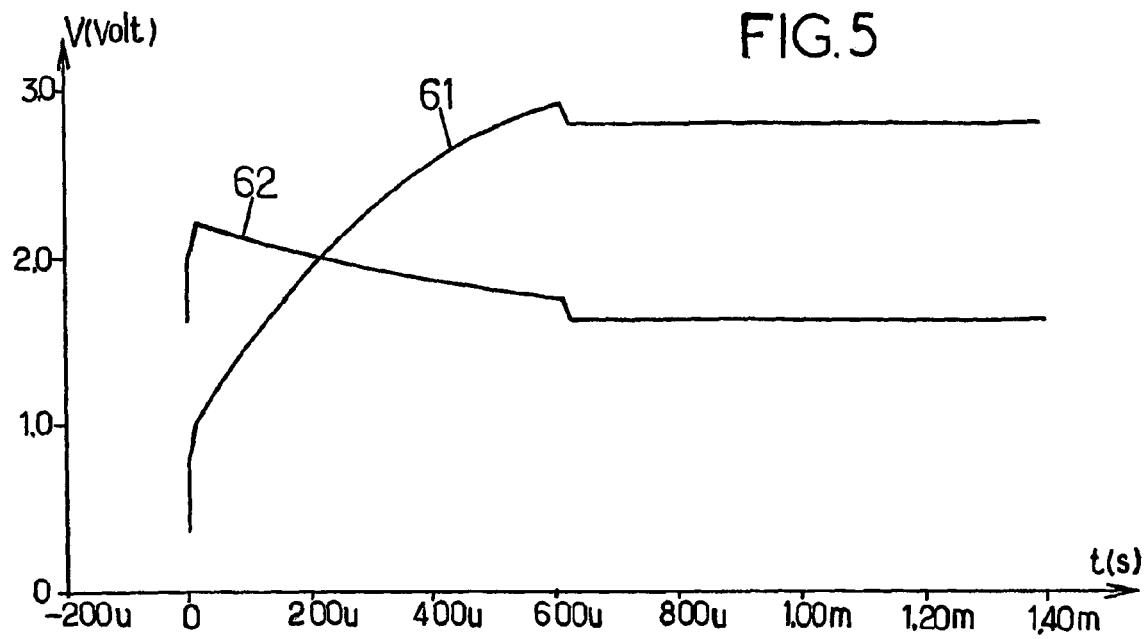
FIG. 5 is a graph showing the input and output transient voltage responses of the circuit according to the invention; and, FIG. 6 is a circuit diagram showing a second embodiment of the circuit according to the invention.

In FIG. 5, the curves 61 and 62 show the transient voltage response of the input of the VCO and of the output of the PFD of the PLL respectively, following a change of radio channel occurring at the time t=0.

In the situation represented by the curve 61, the channel control signal causes the mean input voltage of the VCO to change from 370 mV to 2.8 V. The pre-charging time, to within 1 mV of error, is of the order of 1 ms.

As shown by the curve 62, the output voltage of the PFD remains substantially constant during the pre-charging, at the common mode voltage (i.e. at 1.65 V).

Preferably, the polarization means 53 are deactivated after the pre-charging means 52. This makes it possible to reduce the injections of charge at the terminals of the voltage shift capacitor Ca. This is obtained by an appropriate time difference between the control signals CTRL1 and CTRL2. This time difference is for example of the order of 1 μs.

Figure 6:
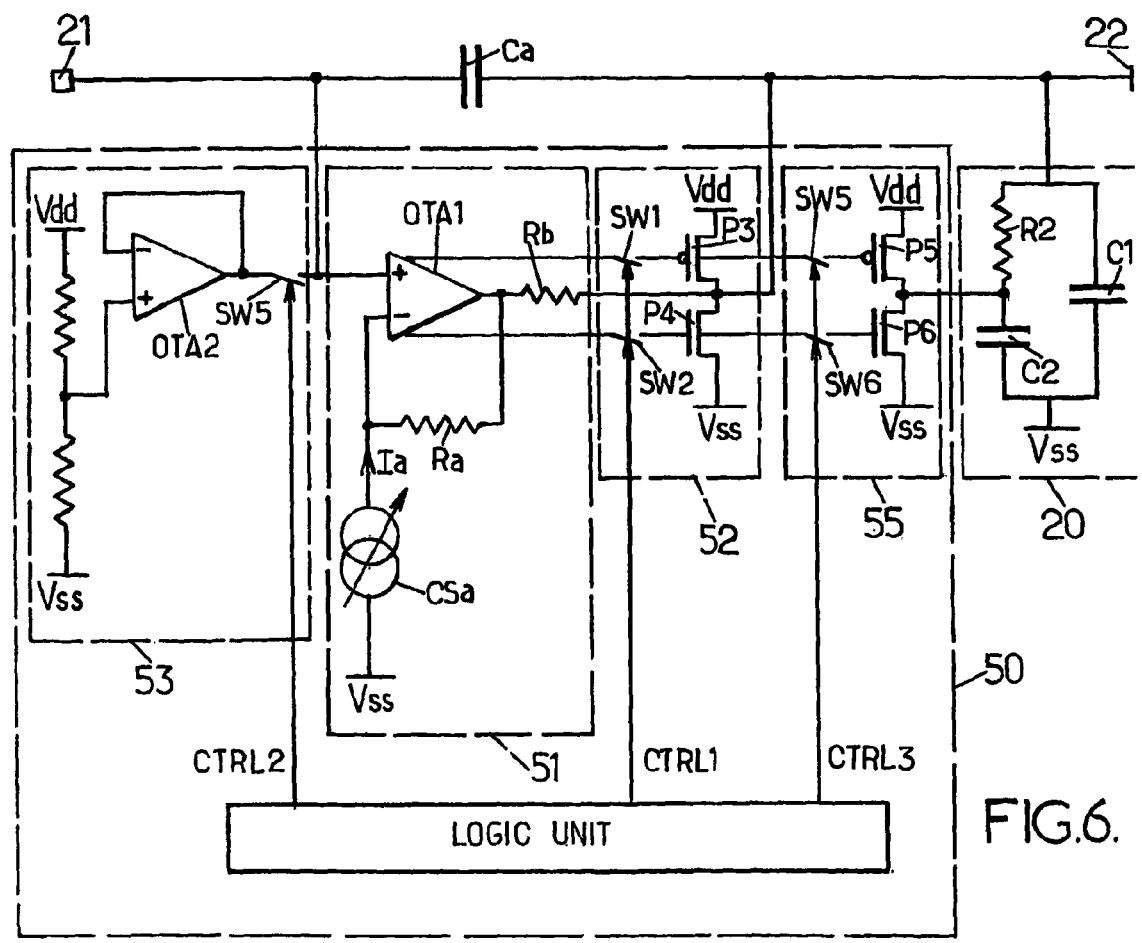

The circuit diagram shown in FIG. 6 illustrates another embodiment of the circuit according to the invention, which constitutes a refinement of the one shown in FIG. 2. In FIG. 6, the components that are the same as those in FIG. 2 bear the same references and will not be described again.

As the loop filter 20 comprises an RC phase correction network formed by the components R2 and C2, it has been observed that, when the current supplied by the PFD is low, the resistor R2 becomes effectively high and can increase the pre-charging duration. It is therefore advantageous to have a controlled current source for charging the capacitor C2.

In the illustrated embodiment, such a controlled current source 55 comprises an additional push-pull stage P5-P6, connected as a mirror with the push-pull state P3-P4 of the pre-charging means 52 and with respect to the push-pull output stage P1-P2 of the operational amplifier OTA1. More particularly, this additional push-pull stage comprises two transistors P5 and P6, a PMOS transistor and an NMOS transistor respectively, connected in series between the terminals Vdd and Vss, the gate of the transistor P5 being connected to the gate of the transistor P3 via a controlled switch SW5, and the gate of the transistor P6 being connected to the gate of the transistor P4 via another controlled switch SW6. The push-pull output stage P5-P6 is connected to the centre point of the RC network, that is to say between the resistor R2 and the capacitor C2, the former being connected between output 22 of the circuit and said centre point and the latter being connected between said centre point and the terminal Vss.

The closing, of the switches SW5 and SW6 is controlled by a control signal CTRL3 generated by the logic unit 54, independently from the activation of the pre-charging means by the signal CTRL1. As a variant, it can be controlled by the signal CTRL1.

The additional push-pull stage P5-P6 can also be integrated in the operational amplifier OTA1 of the pre-charging means 51.

The invention claimed is:

1. Voltage shift control circuit intended to be placed in parallel with at least one voltage shift capacitor having a first terminal connected to an output of the phase comparator and a second terminal connected to an input of the voltage controlled oscillator of a phase locked loop and comprising:
an input, intended to be coupled with the output of the phase comparator;
an output, intended to be coupled with the input of the voltage controlled oscillator;
controlled charging means, designed to charge the voltage shift capacitor according to a control signal;
controlled pre-charging means, designed to accelerate the charging of the voltage shift capacitor by the controlled charging means; and
controlled electrical polarization means, designed to ensure the electrical polarization of the input during the pre-charging of the voltage shift capacitor,
wherein the charging means includes a first operational amplifier and the polarization means includes a second operational amplifier.

2. Circuit according to claim 1, wherein the controlled charging means comprise the first operational amplifier connected as a voltage follower between the input and the output, a resistor placed in the feedback loop of the operational amplifier, and a controlled current source supplying a current of specified value through said resistor.

3. Circuit according to claim 2, wherein the operational amplifier of the charging means comprise a push-pull output stage, and wherein the charging means further comprise a resistor of high value connected in series between the output of the operational amplifier and the output of the circuit.

4. Circuit according to claim 3, wherein the controlled pre-charging means comprise a push-pull stage which, in the activation of the pre-charging means configuration, is arranged as a mirror with respect to the push-pull output stage of the operational amplifier of the charging means, in such a way as to short-circuit the high value resistor.

5. Circuit according to claim 4, wherein the push-pull stage of the pre-charging means is designed to deliver a current higher than the current delivered by the push-pull output stage of the operational amplifier of the charging means.

6. Circuit according to claim 1, wherein the controlled polarization means comprise the second operational amplifier connected as a voltage follower which, in the activation of the controlled polarization means configuration, is arranged to impose a common mode voltage on the input of the circuit.

7. Circuit according to claim 1, further comprising means for deactivating the controlled pre-charging means before the controlled polarization means.

8. Circuit according to claim 2, further comprising an additional controlled push-pull stage whose output is intended to be connected to the centre point of an RC network of a loop filter of the PLL and which, in the activation configuration, is connected as a mirror with respect to the push-pull stage of the controlled pre-charging means and with respect to the push-pull output stage of the operational amplifier of the charging means.

9. Circuit according to claim 8, wherein the additional controlled push-pull stage is integrated with the operational amplifier of the charging means.

10. Circuit according to claim 1, designed in CMOS technology.

11. Phase locked loop comprising a phase or frequency comparator, a loop filter, a voltage controlled oscillator, a voltage shift capacitor coupled in series between the phase comparator and the voltage control led oscillator, and a voltage shift control circuit according to claim 1 placed in parallel with the voltage shift capacitor and comprising:
an input, intended to be coupled with the output of the phase comparator;
an output, intended to be coupled with the input of the voltage controlled oscillator;
controlled charging means, designed to charge the voltage shift capacitor according to a control signal and including a first operational amplifier;
controlled pre-charging means, designed to accelerate the charging of the voltage shift capacitor by the controlled charging means; and
controlled polarization means, designed to ensure the polarization of the input during the pre-charging of the voltage shift capacitor and including a second operational amplifier.

12. Radio-frequency transmitter, having a phase locked loop for generating a radio-frequency signal to be transmitted, said phase locked loop comprising a phase or frequency comparator, a loop filter, a voltage controlled oscillator, a voltage shift capacitor coupled in series between the phase comparator and the voltage controlled oscillator, and a voltage shift control circuit according to claim 1 placed in parallel with the voltage shift capacitor and comprising:
an input, intended to be coupled with the output of the phase comparator;
an output, intended to be coupled with the input of the voltage controlled oscillator;
controlled charging means, designed to charge the voltage shift capacitor according to a control signal and including a first operational amplifier;
controlled pre-charging means, designed to accelerate the charging of the voltage shift capacitor by the controlled charging means; and
controlled polarization means, designed to ensure the polarization of the input during the pre-charging of the voltage shift capacitor and including a second operational amplifier.

13. Mobile terminal of a radio-communications system with a radio-frequency transmitter having a phase locked loop for generating a radio-frequency signal to be transmitted, said phase locked loop comprising a phase or frequency comparator, a loop filter, a voltage controlled oscillator, a voltage shift capacitor coupled in series between the phase comparator and the voltage controlled oscillator, and a voltage shift control circuit according to claim 1 placed in parallel with the voltage shift capacitor and comprising:
an input, intended to be coupled with the output of the phase comparator;
an output, intended to be coupled with the input of the voltage controlled oscillator;
controlled charging means, designed to charge the voltage shift capacitor according to a control signal and including a first operational amplifier;

controlled pre-charging means, designed to accelerate the charging of the voltage shift capacitor by the controlled charging means; and controlled polarization means, designed to ensure the polarization of the input during the pre-charging of the voltage shift capacitor and including a second operational amplifier.

14. Base station of a radio-communications system with a radio-frequency transmitter having a phase locked loop for generating a radio-frequency signal to be transmitted, said phase locked loop comprising a phase or frequency comparator, a loop filter, a voltage controlled oscillator, a voltage shift capacitor coupled in series between the phase comparator and the voltage controlled oscillator, and a series voltage shift control circuit according to claim 1 placed in parallel with the voltage shift capacitor and comprising:

an input, intended to be coupled with the output of the phase comparator;

an output, intended to be coupled with the input of the voltage controlled oscillator;

controlled charging means, designed to charge the voltage shift capacitor according to a control signal and including a first operational amplifier;

controlled pre-charging means, designed to accelerate the charging of the voltage shift capacitor by the controlled charging means; and controlled polarization means, designed to ensure the polarization of the input during the pre-charging of the voltage shift capacitor and including a second operational amplifier.

* * * * *